(12) United States Patent
Lin et al.

(10) Patent No.: US 6,261,930 B1
(45) Date of Patent: Jul. 17, 2001

(54) METHOD FOR FORMING A HEMISPHERICAL-GRAIN POLYSILICON

(75) Inventors: Ping-Wei Lin, Chia-I; Jui-Ping Li, I-Lan Hsian; Ming-Kuan Kao, Hsin-Chu; Yi-Shin Chang, Taipei, all of (TW)

(73) Assignee: Mosel Vitelic Inc., Hsin-Chu (TW)

( * ) Notice: Subject to any disclaimer, the term of this patent is extended or adjusted under 35 U.S.C. 154(b) by 0 days.

(21) Appl. No.: 09/287,440

(22) Filed: Apr. 7, 1999

(51) Int. Cl.[7] .......................... H01L 21/20; H01L 21/36; C03B 21/48
(52) U.S. Cl. .......................... 438/488; 438/398
(58) Field of Search .................... 438/253, 398, 438/488, 665, 758, 299, 396

(56) References Cited

U.S. PATENT DOCUMENTS

| | | | |
|---|---|---|---|
| 5,326,722 | * | 7/1994 | Huang .................... 438/299 |
| 5,930,625 | * | 7/1999 | Lin et al. ................ 438/253 |
| 6,020,247 | * | 2/2000 | Wilk et al. .............. 438/398 |
| 6,087,240 | * | 7/2000 | Gilchrist ................. 438/398 |

* cited by examiner

Primary Examiner—David Nelms
Assistant Examiner—Phuc T. Dang

(57) ABSTRACT

An irradiation process method for forming polysilicon layer is disclosed. The method includes firstly forming an alpha-silicon layer on substrate. Then the temperature of the UHV-CVD chamber is increased and the wafer is sent into the chamber. Gas is then intermittently conducted into the vacuum-chamber apparatus. While increasing the temperature of the vacuum-chamber apparatus, the whole through-put thus increases and the process-time for the polysilicon layer thus decreases. Finally, the electrical capacity thus increases by forming the polysilicon layer.

14 Claims, 2 Drawing Sheets

METHOD FOR FORMING A HEMISPHERICAL-GRAIN POLYSILICON

BACKGROUND OF THE INVENTION

1. Field of the Invention

The present invention relates to the formation of a polysilicon layer, and more particularly to a method for the formation of polysilicon layer by irradiating with intermittently conducting $Si_2H_6$ gas process on a silicon substrate layer of silicon wafer for a semiconductor.

2. Description of the Prior Art

Currently, the demand for high-density dynamic random access memory (DRAM) has rapily increased due to the widespread use of electronic equipment. In particular, the increasing popularity of some electronic equipment such as, for example, many kinds of computers are gradually increasing the demand for the large or very large semiconductor memories. Therefore, the advanced manufacture technology for improvement fabrication of DRAm is urgently needed.

No doubt one of the main technologies for improving DRAM performance is the Hemi-Spherical Grain (HSG) process. In fact, the recently Hemi-Spherical Grain (HSG) process is gradually applied to the production technology of High-Density DRAM. Futhermore, HSG process ideally will increase the surface area of the silicon layer in order to expand the capacity of the DRAM. This issue has been presented by previous laboratory experience already.

Basically, the HSG process firstly involves the deposit of an alpha-silicon thin film on the substrate of silicon wafer inside a PCVD furnace at 1 torr and 510°C to 550°C. Consequentially, the alpha-Silicon film surface is cleaned using SC-1 wet cleaning and then the native oxide layer is removed by HF dipping. Afterwards, HSG will grow in the UHV-CVD system chamber. When the wafer is irradiated for about 60 seconds, gas is conducted into the chamber. At this step, the temperature is arrived at about 200°C to 300°C as shown in FIG. 1A, then the flow of gas ceases after about 60 seconds. Thirdly, the temperature is held at 600°C. The whole treatment time is about 300 seconds at least. The pressure is about $10^{-5}$ torr when the gas is being conducted into the chamber. Also, when the gas is not conducted into the chamber, the pressure will be about $10^{-8}$ torr as shown FIG. 1B. Also the flow of the gas fluid is about 10 sccm.

However, unfortunately the HSG process is still not totally desirable because it usually will take a long time for treating each wafer. On the other hand, it is still necessary to be refined again. Accordingly, the present invention presents a brand new preferred method.

SUMMARY OF THE INVENTION

In accordance with the present invention, a method is provided for forming a polysilicon layer that substantially exists on the substrate of a silicon wafer of a semiconductor.

In one embodiment, a polysilicon layer is first formed. Next an alpha-silicon layer is formed on the substrate. Then the temperature of the vacuum-chamber apparatus is increased as well. Sequentially the wafer is sent into the vacuum-chamber. After about 60 seconds, the gas is conducted intermittently into the vacuum-chamber when the temperature reaches about 200° C. to 300° C. Then the flow of gas is ceased. Sequentially, the temperature of wafer is held at about 600° C. and the gas is conducted and ceased a few times into the vacuum-chamber apparatus in order to irradiate this polysilicon layer. Not only is the process time for this polysilicon layer decreased but also the throughput in increased, and thereby the polysilicon layer is formed.

The intermittently conducting gas method for the present process forming polysilicon layer, which process is isolated as the following steps including both of the transmitting gas and ceasing gas process, is undertaken in a combination cycle and is repeated three times. Therefore, the whole conducting gas process invloves transmitting gas for few seconds and ceasing the flow of gas for few seconds, then transmitting gas for few seconds and ceasing the flow of gas gas for few seconds again and, finally transmitting gas for few seconds and ceasing the flow of gas for few seconds.

According to these processes, throughput thus increases and the process time for the polysilicon layer thus decreases in the formation of the polysilicon layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

A method for forming a polysilicon layer is provided, and the details of the heating method are described as follows.

Figure 1:
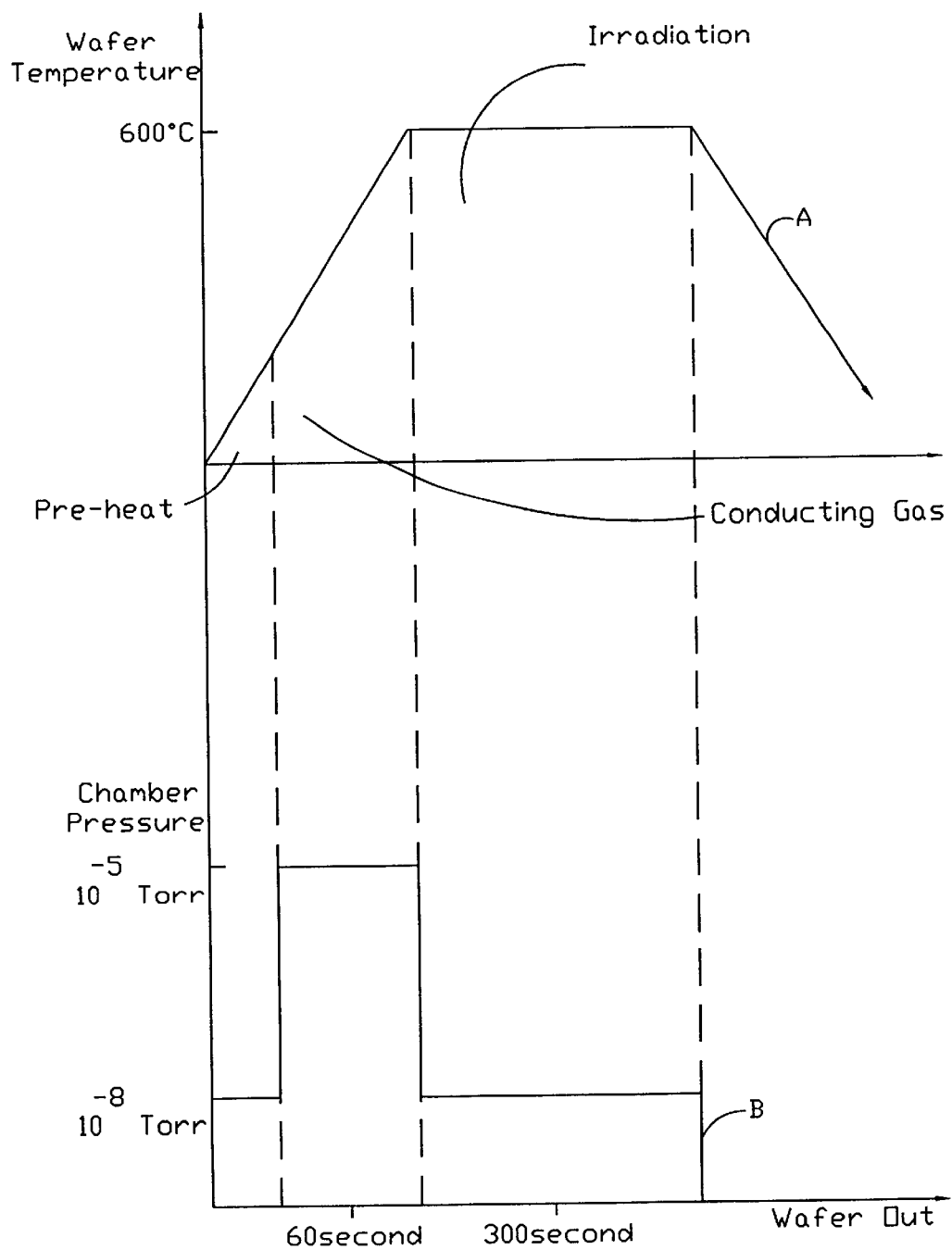
FIG. 1A shows the flow chart of the annealing process according to the conventional method.
FIG. 1B shows the pressure for conducting gas according to the conventional invention.
Figure 2:
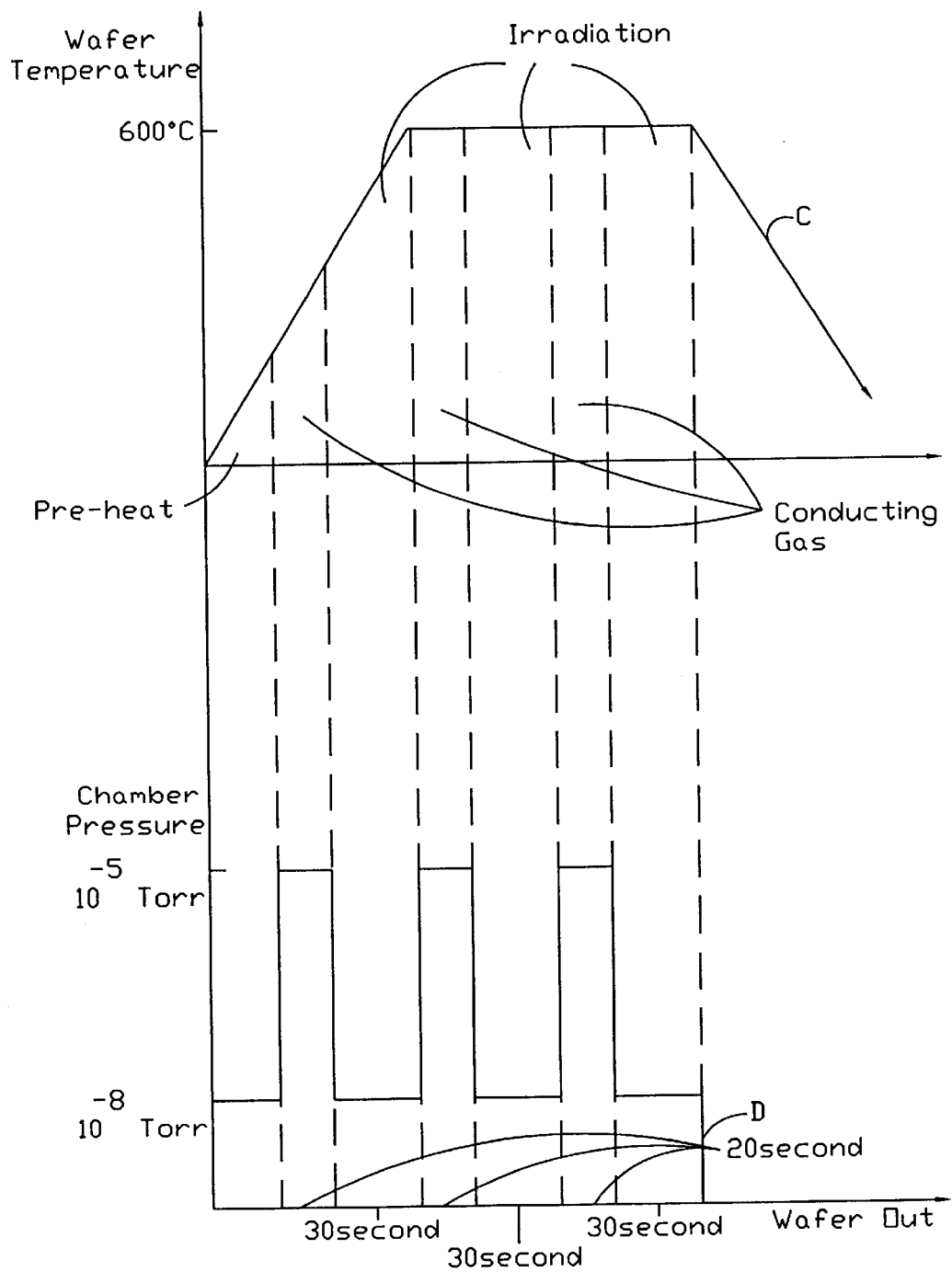
FIG. 2C shows the flow chart of the annealing process according to the present invention.
FIG. 2D shows the pressure for conducting gas according to the present invention.

Firstly an amorphous silicon layer is formed on the substrate. Consequentially this amorphous silicon layer is cleaned using SC-1 wet cleaning and then the native oxide layer is removed by HF dipping. Sequentially the temperature of the high-vacuum chamber, JEL2000 UHVCVD is increased to 700° C. to 800° C. Then the wafer is sent into the vacuum-chamber. When the wafer is preheated about 60 seconds, the temperature is about 200° C. to 300° C., as shown in FIG. 2C. The fluid $Si_2H_6$ gas is firstly conducted intermittently into the high-vacuum chamber then the flow of $Si_2H_6$ gas is ceases. The duration time for the above conducting gas is about 20 seconds as illustrated in FIG. 2D. Then the temperature of the wafer is held at 600° C. and the flow of $Si_2H_6$ gas is conducted and ceased in an intermittent way, the process possibly being repeated about two times, into vacuum-chamber apparatus in order to anneal the polysilicon layer. In other words, the duration time for ceasing the flow of gas is about 30 seconds. Finally the specimen will be cooled down as well as the temperature naturally from the high-vacuum chamber apparatus.

The intermitten conduction gas method includes the following steps which include the transmitting of the gas, the ceasing of the flow of gas and the combination of these cycles repeated three times. Therefore, the whole conducting gas process includes transmitting gas for twenty seconds and ceasing the flow of gas for thirty seconds, the transmitting gas for twenty seconds and ceasing the flow of gas for thirty seconds again and, finally transmitting gas for few seconds and ceasing the flow of gas for few seconds.

In the process, some related parameters also will be mentioned relative to a preferred situation. When the temperature of the wafer increases to about 600° C., the pressure of the vacuum-chamber apparatus will be maintained at about $10^{-5}$ torr. The pressure will be about $10^{-8}$ torr when the flow gas ceases. At the above step, the flux also could be carefully considered as 10 sccm.

Normally seeding progress is carried out properly by conducting $Si_2H_6$ gas. This progress is a kind of formation for nucleation of the silicon atom. As a matter of fact, the seeding process is one of the prime reasons for conducting $Si_2H_6$ gas.

When heating and conducting intermittently a $Si_2H_6$ gas through a silicon wafer, heating by irradiation is continuously delivered uniformly to one side of the wafer, through the use of a gas as a conduction medium. Also heat is continuously removed from the opposite side of the wafer through the use of the same gas principally as a convection medium.

At this moment, silicon atoms will deposit on the surface of the substrate sequentially. The deposit will become bigger and bigger, and eventually develop into a silicon cluster, for example, through nucleation formation. Normally then it is formed such as grain as well the grain will grow continuously. Migration is carried out as the mentioned polysilicon layer covering substrate.

Therefore, $Si_2H_6$ gas forms as a migration droplet source within a first surface of silicon of semiconductor material. This provides a heating source body to gather the deposited silicon and causes the resulting droplet to migrate through the silicon body in the direction of a second surface of the silicon body. Then it will place the silicon body in a position to the heat source body. Generally the combination of the step for providing the high heat conductivity gas at pressure is about $10^{-5}$ torr to $10^{-8}$ torr. One portion of which is in heat exchange contact with the heat source.

The second surface of the silicon body to deliver heat by conduction uniformly to the silicon body's second surface. The other portion of which is in heat exchange contact with the first surface of the silicon body and a relatively colder body to remove heat continuously from the silicon body. In addition, the fluid flux and the fluid flux speed of gas could probably effect the result of annealing process. Normally this is a necessary condition.

Therefore, according to the above process, the formation mechanism could be described as follows. Firstly at the temperature of crystallization, the mobility of surface atoms enables them to nucleate at the amorphous silicon surface. Then the nucleation rate at the surface may be higher than at the amorphous $Si/SiO_2$ interface, at least near 600° C. The grain growth can proceed in three ways:
1. Conventional solid phase growth from the nucleus downward into the amorphous Si.
2. A novel mode in which atoms with high mobility climb up the nucleus surface.
3. The nucleus virtually acts as a sink for such surface migrating atoms and grows into the Si grain.

The main purpose of annealing is as a method for releasing energy. Generally, there are three stages for the annealing process, which include recovery, recrystallization and grain growth.

Normally reactions occuring during the recovery stage are able to continue during the process of recrystallization. The third stage of annealing is grain growth which occurs when annealing is continued after recrystallization has been completed. In grain growth, certain ones of the crystallization grains continue to grow in size.

Although specific embodiments have been illustrated and described, it will be obvious to those skilled in the art that various modifications may be made without departing from what is intended to be limited solely by the appended claims.

What is claimed is:

1. A method for forming a hemispheric-grain polysilicon layer, said method comprising:
    forming an amorphous-silicon layer on a substrate in a first vacuum-furnace;
    removing a native oxide layer which is formed and accompanied with said amorphous-silicon;
    increasing temperature of a second vacuum-furnace apparatus to an estimated temperature;
    loading said wafer into said second vacuum-furnace apparatus;
    first conducting gas into said second vacuum-furnace apparatus and ceasing the gas;
    conducting gas into said second vacuum-furnace apparatus to said polysilicon layer while increasing the temperature of the vacuum-furnace apparatus then transmitting gas into the furnace and then ceasing the gas thereafter repeating said transmitting gas and said ceasing gas until said hemispherical-grain polysilicon layer is formed so that throughput thus increasing herein the process time for said polysilicon layer thus decreasing thereby forming said polysilicon layer.

2. The method according to claim 1, wherein said removing the native oxide layer comprises HF dipping.

3. The method according to claim 1, wherein said increasing temperature of a second vacuum-furnace apparatus to an estimated temperature is about 700° C. to 800° C.

4. The method according to claim 1, wherein said temperature of said wafer increases to about 600° C.

5. The method according to claim 1, wherein pressure of said vacuum-furnace in said conducting gas step is about $10^{-5}$ torr and pressure of vacuum-furnace in said ceasing gas step is about $10^{-5}$ torr.

6. The method according to claim 1, wherein duration time of said irradiation the said polysilicon layer is less than five minutes.

7. The method according to claim 1, wherein said polysilicon layer is used as an electrical capacitor layer.

8. The method according to claim 1, wherein said repeating said transmitting gas and said ceasing gas comprises two times.

9. A method for conducting gas for forming hemispherical-grain polysilicon layer, said method comprising the following steps: increasing and holding temperature of a second vacuum-chamber;
    loading said wafer into said second vacuum-chamber;
    transmitting gas into said chamber for performing seeding;
    ceasing the gas and thus achieving annealing; and
    repeating said transmitting gas and said ceasing gas until said hemispherical-grain polysilicon layer is formed.

10. The method according to claim 9, wherein duration time for transmitting the said gas is at least about 20 seconds.

11. The method according to claim 9, wherein duration time for ceasing the said gas is at least about 30 seconds.

12. The method according to claim 9, wherein said gas comprises $Si_2H_6$.

13. The method according to claim 9, wherein flux of said gas is about 10 sccm.

14. The method according to claim 9, wherein said conducting stepped gas method is suitable for repeating said seeding and annealing steps at least two times.

* * * * *